United States Patent [19]
Spurr et al.

[11] Patent Number: 5,966,394
[45] Date of Patent: Oct. 12, 1999

[54] LASER DIODE CONTROLLER

[75] Inventors: Robert W. Spurr, Rochester; Seung H. Baek, Pittsford; Thomas A. Mackin, Hamlin; William R. Markis, Spencerport; Kurt M. Sanger, Rochester, all of N.Y.

[73] Assignee: Eastman Kodak Company, Rochester, N.Y.

[21] Appl. No.: 08/866,437

[22] Filed: May 30, 1997

[51] Int. Cl.⁶ .................................................. H01S 3/04
[52] U.S. Cl. ................................ 372/34; 372/38; 372/29
[58] Field of Search ........................... 372/38, 29, 36, 372/34

[56] References Cited

U.S. PATENT DOCUMENTS

| | | | |
|---|---|---|---|
| 4,745,610 | 5/1988 | Yoshikawa | 372/38 |
| 4,835,780 | 5/1989 | Sugimura et al. | 372/29 |
| 4,837,787 | 6/1989 | Takesue et al. | 372/29 |
| 5,276,671 | 1/1994 | Minami et al. | 372/38 |
| 5,276,697 | 1/1994 | Davis | 372/38 |
| 5,309,458 | 5/1994 | Carl | 372/38 |
| 5,315,606 | 5/1994 | Tanaka | 372/38 |
| 5,479,425 | 12/1995 | Tegge | 372/29 |
| 5,513,197 | 4/1996 | Koishi | 372/38 |
| 5,598,040 | 1/1997 | Markis | 372/38 |
| 5,602,860 | 2/1997 | Masonson | 372/36 |

*Primary Examiner*—Rodney Bovernick
*Assistant Examiner*—Yisun Song
*Attorney, Agent, or Firm*—Nelson Adrian Blish; David A. Novais

[57] ABSTRACT

A laser diode controller (30) having a constant current source (60) which supplies current to a laser diode (90) is disclosed. A current shunt switch (40) directs current to either the laser diode (90) or to a bypass circuit (42). A thermal compensator (70) alters a current level of the constant current source (60) as a function of on-time of the laser diode (90) to compensate for changes in optical power conversion efficiency due to temperature changes in the laser diode. A thermo electric cooler controller (80) maintains a constant temperature of a substrate on which the laser diode is mounted. In one embodiment, an array of sample and hold amplifiers (50) eliminates a need for multiple DACs.

25 Claims, 9 Drawing Sheets

Figure 6. Under Corrected Thermal Compensation

Figure 7. Over Corrected Thermal Compensation

Figure 8. Correct Thermal Compensation 92-406

LASER DIODE CONTROLLER

FIELD OF THE INVENTION

This invention relates generally to techniques for efficiently using laser diodes in laser writers such as printers, and more particularly to laser diode controllers for such printers.

BACKGROUND OF THE INVENTION

High power laser diodes are used as a light source in laser thermal printing systems, for color proofing systems, dry image setters, and other high quality, halftone printing systems for graphic arts applications.

In this type of laser thermal printing system, a photosensitive media is placed on a drum and is written on by a printhead which consists of multiple high power laser diodes and an imaging lens. As the image is written pixel by pixel, small areas of the photosensitive material are heated causing transfer of the material either from a donor to a receiver or from a donor to the air. In the case of plate writing, a plate is directly imaged creating hydrophobic or hydrophilic spots, after additional chemical processing and post heat treatment. The amount of dye transferred or ablated is controlled by the amount of laser energy delivered.

Laser optical power must be controlled to better than 0.5% accuracy in order to obtain a reasonable image quality. Optical power is affected by many parameters, such as laser diode driving current, operating temperature, and imaging lens system. The electronic control for the laser diode is sophisticated and complex.

In order to increase productivity, an array of laser diodes is often used in printheads. If very high laser power is required, for example, to write on slow laser thermal media, the laser driving current at nominal operating condition may be as much as 1.5 Amps per channel. A high productivity printing system with many writing channels would therefore require significant power, and generate significant heat, which would affect optical power. One attempt to deal with temperature change in a laser diode is shown in U.S. Pat. No. 5,479,425, which describes a current shunt around the laser diode. This reference, however, does not vary the temperature, only the current to the laser diode.

To maintain high productivity, driving current rise-fall time (current change from 10% to 90% of max value) should be less than 50 nanoseconds. It is difficult to achieve a rise-fall time less than 100 nanoseconds due to high stray capacitance of the driving circuit. Thus, it is seen that as the number of writing channels increases, with relatively high power requirement and fast response time, the laser diode controller electronics becomes complicated and expensive.

SUMMARY OF THE INVENTION

Accordingly, it is an object of the present invention to provide a laser diode controller having a fast rise-fall time, high current capacity, and accurate power control. Another object of the present invention is to provide a laser diode controller which compensates for changes in optical power conversion efficiency due to temperature changes in a laser diode.

According to one feature of the present invention, these and other objects are accomplished by a laser diode controller having a constant current source which supplies current to a laser diode. A current shunt switch directs current to either the laser diode or to a bypass circuit. A thermal compensator alters a current level of the constant current source as a function of on-time of the laser diode to compensate for changes in optical power conversion efficiency due to temperature changes in the laser diode. A thermo electric cooler controller maintains a constant temperature of a substrate on which the laser diode is mounted.

In one embodiment of the invention an array of sample and hold amplifiers provides analog setpoints for the constant current source, current shunt switch, thermal compensator, and laser diode temperature controller. In another embodiment the array of sample and hold amplifiers, constant current source, current shunt switch, thermal compensator, and laser diode temperature controllers are constructed as a compact Application Specific Integrated Circuit (ASIC).

This invention provides a cost effective, compact, laser diode controller which can handle a large driving current with high accuracy, fast current rise time, temperature control, and thermal compensation. The invention, and its objects and advantages, will become more apparent in the detailed description of the preferred embodiments presented below.

DETAILED DESCRIPTION OF THE INVENTION

The present description will be directed in particular to elements forming part of, or cooperation more directly with, an apparatus in accordance with the present invention. It is to be understood that elements not specifically shown or described may take various forms well known to those skilled in the art.

Figure 1:
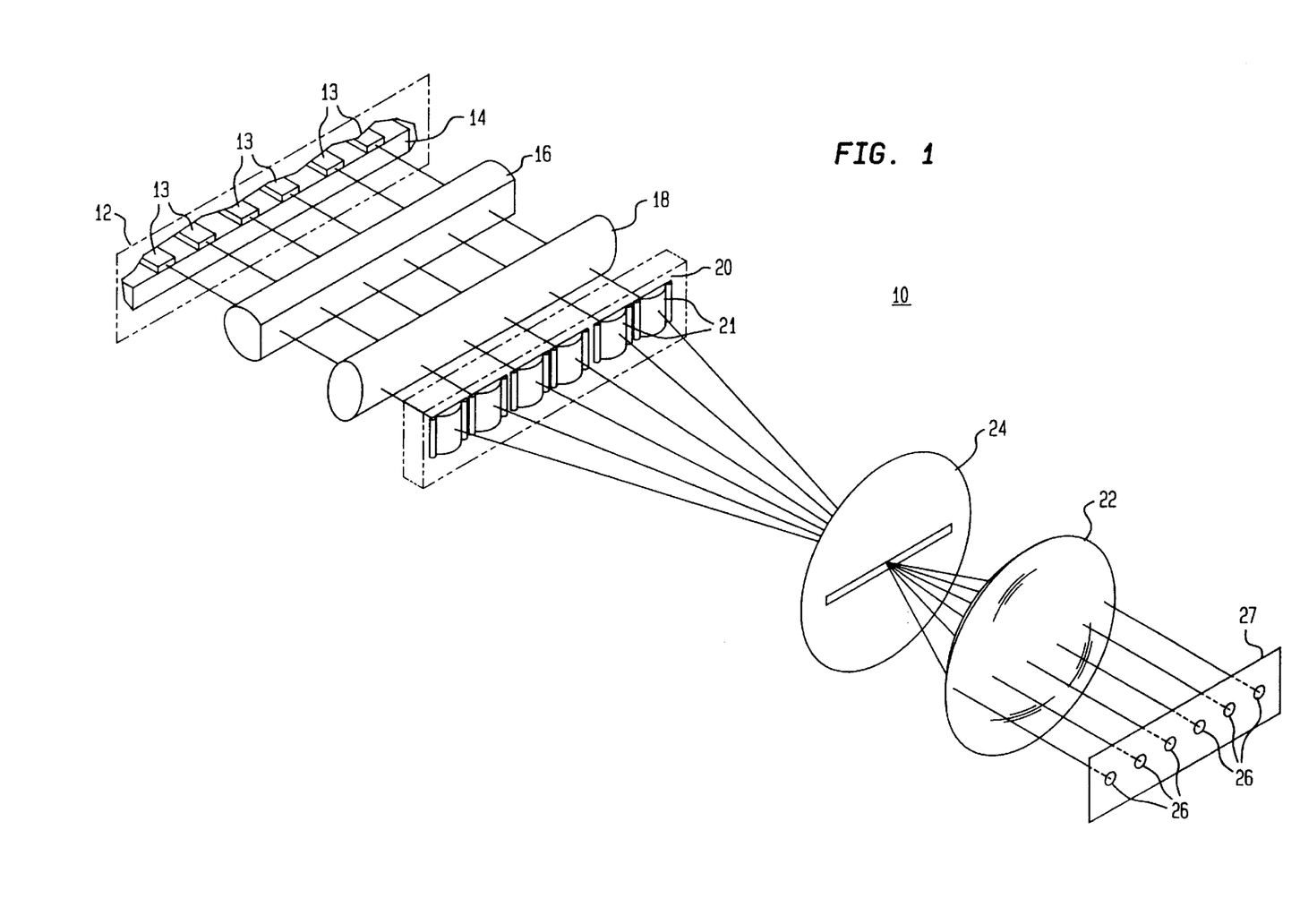
FIG. 1 is a perspective view of an optical arrangement for use with a laser diode array in a laser thermal printer in accordance with the present invention.

Referring to FIG. 1, a laser thermal printer, referred to in general by numeral 10, is shown. A multi-mode laser diode array 12 which comprises a plurality of independently-modulated laser diode sources 13 formed on a substrate 14 functions as a light source. Laser light is focused by a first cylinder lens 16 having a high numerical aperture, a second cylinder lens 18 having a low numerical aperture, a micro lenslet array 20, and a printing lens 22.

Laser Diode Controller

Figure 2:
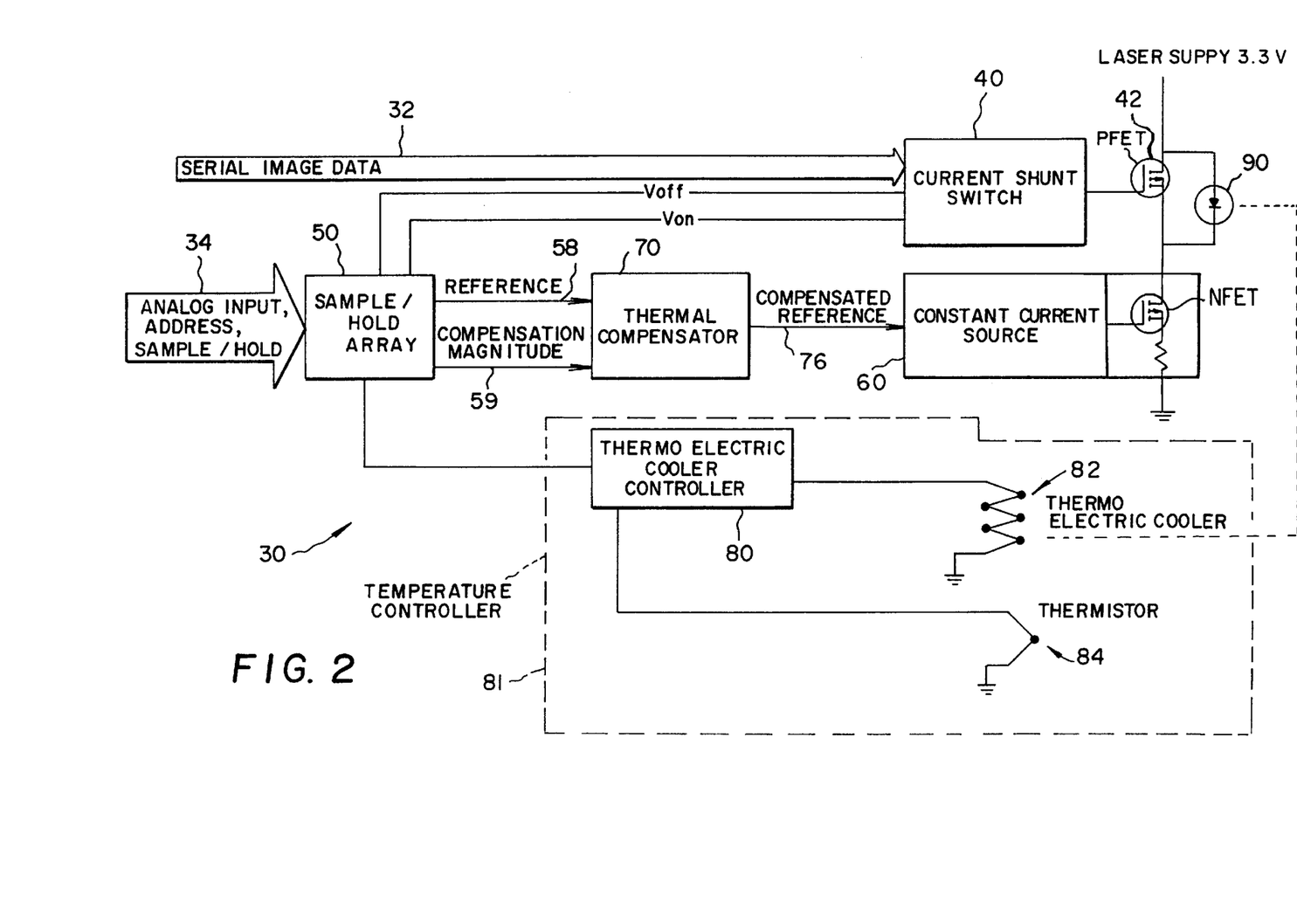
FIG. 2 is a block diagram of a laser diode controller according to the present invention.

FIG. 2 shows a block diagram of a laser diode controller 30. Laser diode controller 30 is comprised in general of a constant current source 60, a current shunt switch 40, a thermal compensator 70 and a thermo-electric cooler controller 80. In the preferred embodiment, the laser diode controller 30 also includes an array of sample and hold amplifiers 50. A microprocessor, not shown, supplies image data 32 to current shunt switch 40.

Current Shunt Switch

Figure 3:
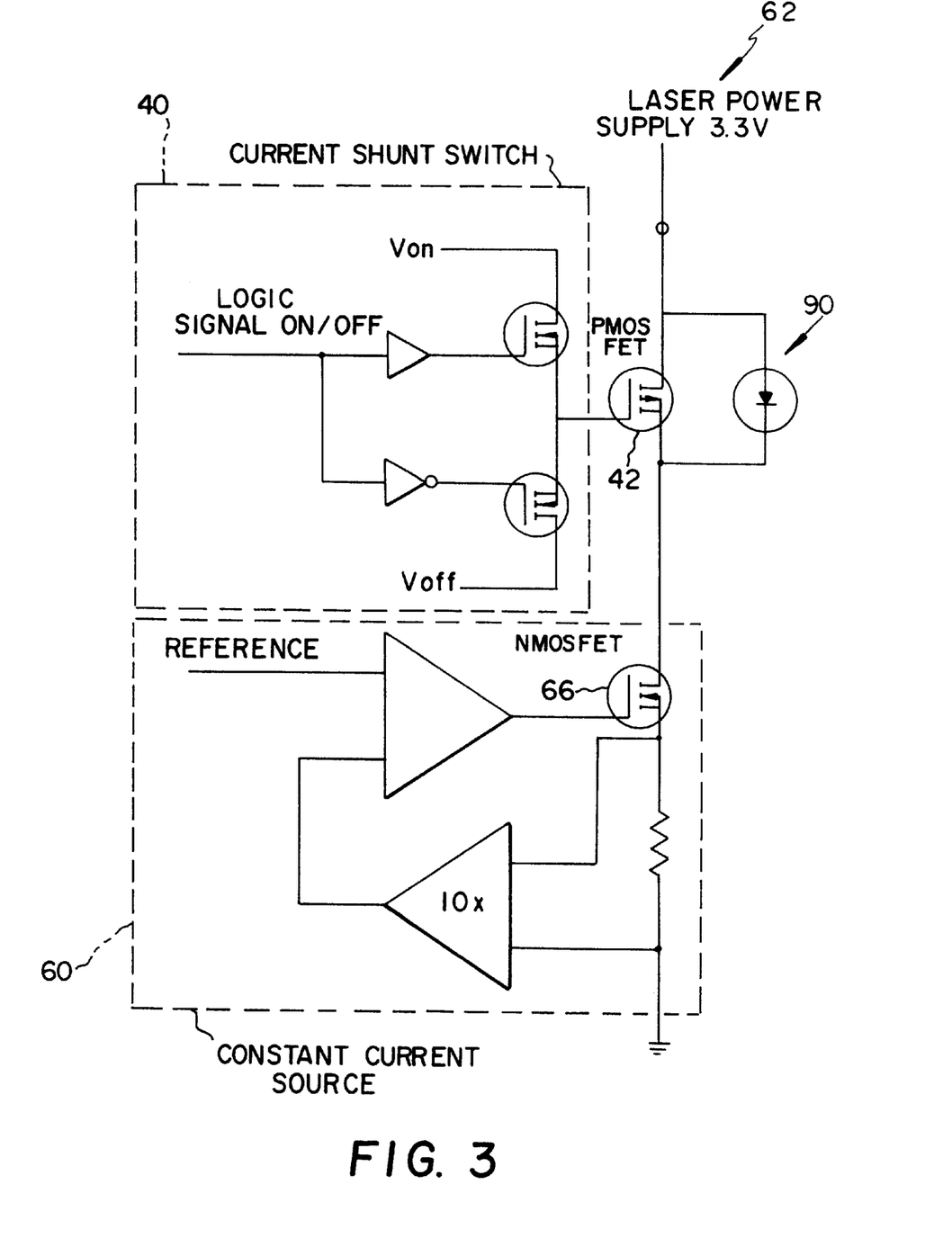
FIG. 3 is a block diagram of a current shunt switch circuit and a constant current source according to the present invention.

A circuit, commonly called a current shunt switch 40, provides fast current rise and fall times to a laser diode 90. Current shunt switch 40 is shown in FIG. 3. To get a fast rise and fall time, a fixed amount of DC current from current source 60 is switched between laser diode 90 and bypass circuit 42. A rise and fall time of less than 20 nanoseconds at a current accuracy of 0.1% is desirable.

Constant Current Source

Laser power supply 62 provides a constant voltage to constant current source 60. Current from constant current source 60 is defined as Iop for the laser diode 90. This current must be accurately controlled (0.1%FS [Full Scale] from 500 ma to 2.0 a) in order for the laser diode 90 to deliver a constant optical power. When not active, the laser diode 90 is placed in standby mode and it's current is reduced to a preset programmable threshold level Ith. The balance of the current, Iop-Ith, is shunted around the laser diode 90 through a bypass circuit 42. Bypass circuit 42 is comprised of a discrete, power, Metal Oxide Semiconductor Field Effect Transistor (MOSFET). Constant current source 60 has a NMOSFET 66 and is tied to laser power supply 62. The accuracy of Ith must be within 5%. For calibration of the laser thermal printer 12, a correct amount of current is determined for each laser diode 90 using a current-optical power curve, and a look-up table is built for the laser diode array 12.

Figure 4:
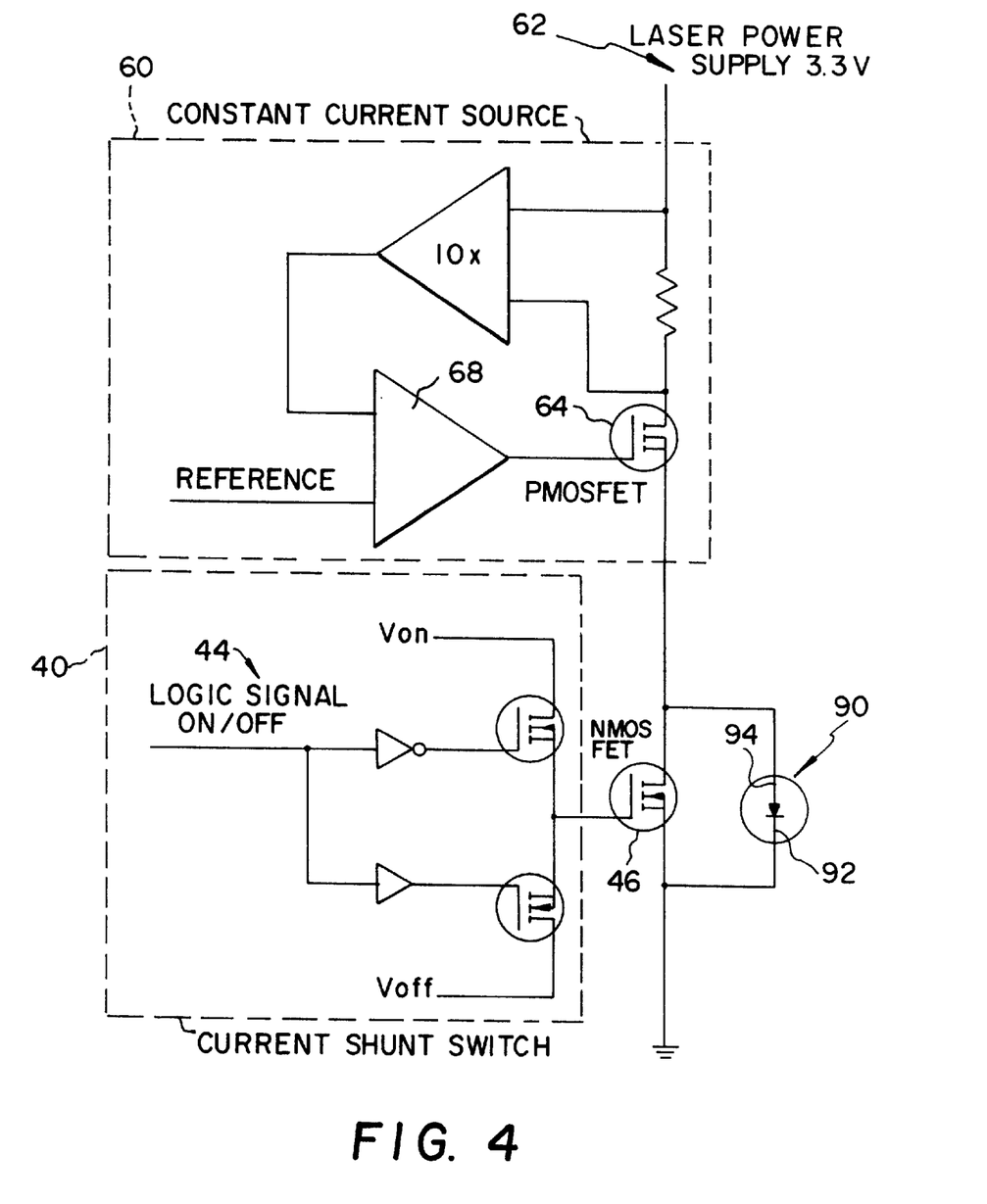
FIG. 4 is a block diagram of an alternate version of the current shunt switch and the constant current source circuit shown in FIG. 3.

Some commercially available laser diodes are configured such that the external case is sometimes connected to either the anode 94 or cathode 92 of the diode. In other cases, an array of laser diodes may be purchased configured such that all diodes are on one common electrical substrate which may be either the anode or cathode of the device. FIG. 4 shows an alternate embodiment of current switch 40 and constant current source 60 that is used when the cathode of each laser diode 90 of laser diode array 12 has a common electrical connection point or is tied to a case containing the laser diode array. In this embodiment, constant current source 60 has a PMOSFET 64 and is tied to laser power supply 62 and the input signals to an operational amplifier 68 which drive PMOSFET 64 are inverted. The current shunt switch 40 is connected to ground and the logic signal 44 is reversed and bypass circuit 46 is an NMOSFET.

Another feature of the design is that it is capable of operating a laser diode array in either a common anode or common cathode configuration. Simply by reversing the shunt MOSFET on and off gate voltages and inverting the polarity of the drive signal for the constant current source, the design is flexible enough to adapt to either configuration.

Thermal Compensator

Figure 5:
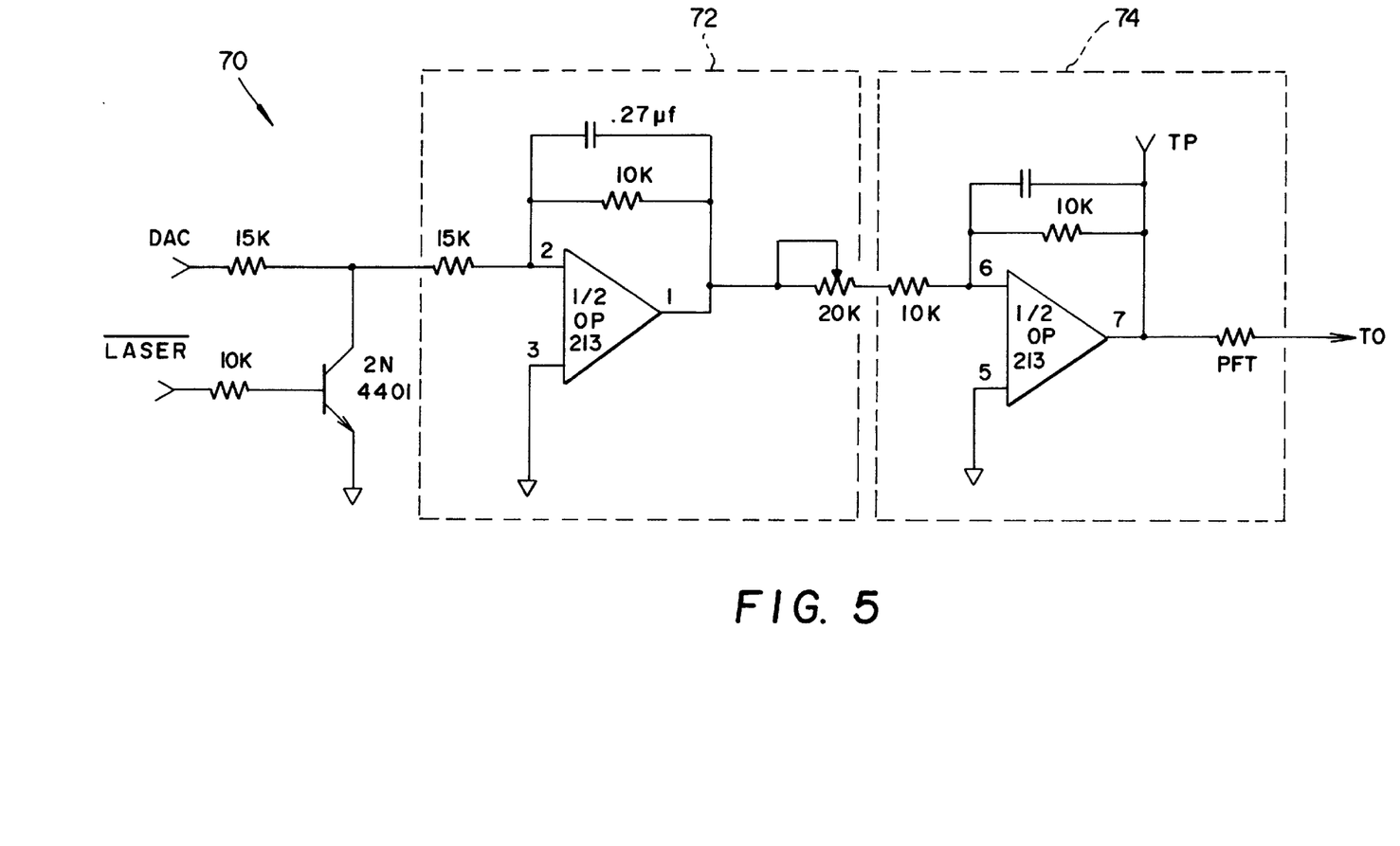
FIG. 5 is a circuit diagram of a thermal compensator according to the present invention.
Figure 6:
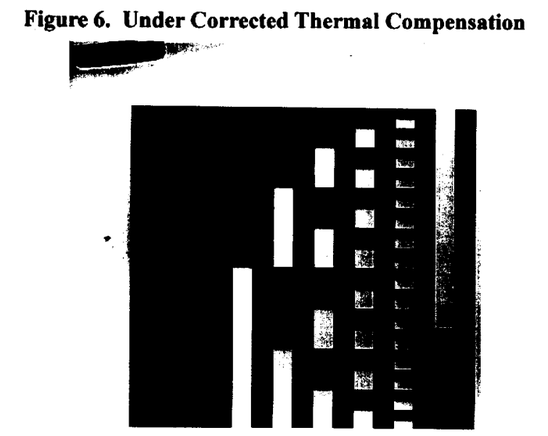
FIG. 6 shows the effects of inadequate thermal compensation on a test image.
Figure 7:
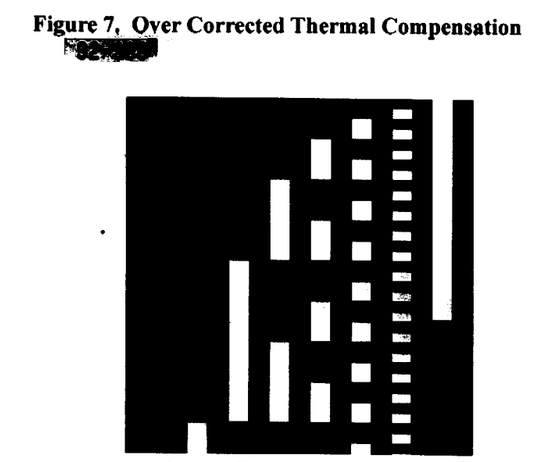
FIG. 7 is shows the effects of excessive thermal compensation on a test image.
Figure 8:
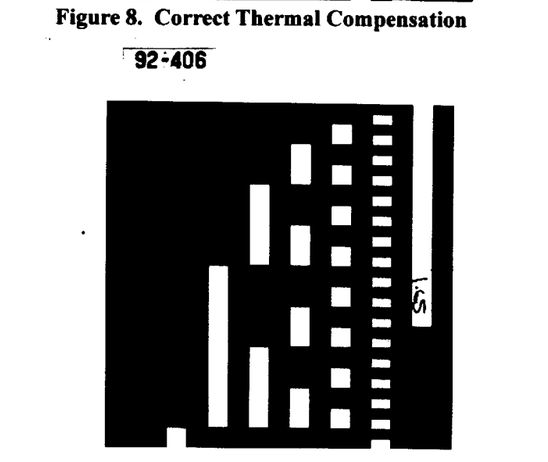
FIG. 8 is shows the effects of proper thermal compensation on a test image.

Thermal compensator 70, shown in FIG. 5, provides thermal compensation to correct the thermal droop which occurs due to heating of the substrate of the laser diode 90. Thermal compensator 70 uses one, two, or multiple filter stages such as 72 and 74, with different time constants according to an accuracy required in the printing system. Filter stages are RC (Resistor Capacitor) circuits. The required thermal time constants may be calculated mathematically using a well known curve fitting routine called a cubic spline. The time constants are used to build filter stages which modify the compensated reference signal 76, shown in FIG. 2. Several image samples are shown in FIGS. 6, 7, and 8 for under correction, over correction, and proper correction on a medium, for example laser thermal film.

Figure 9:
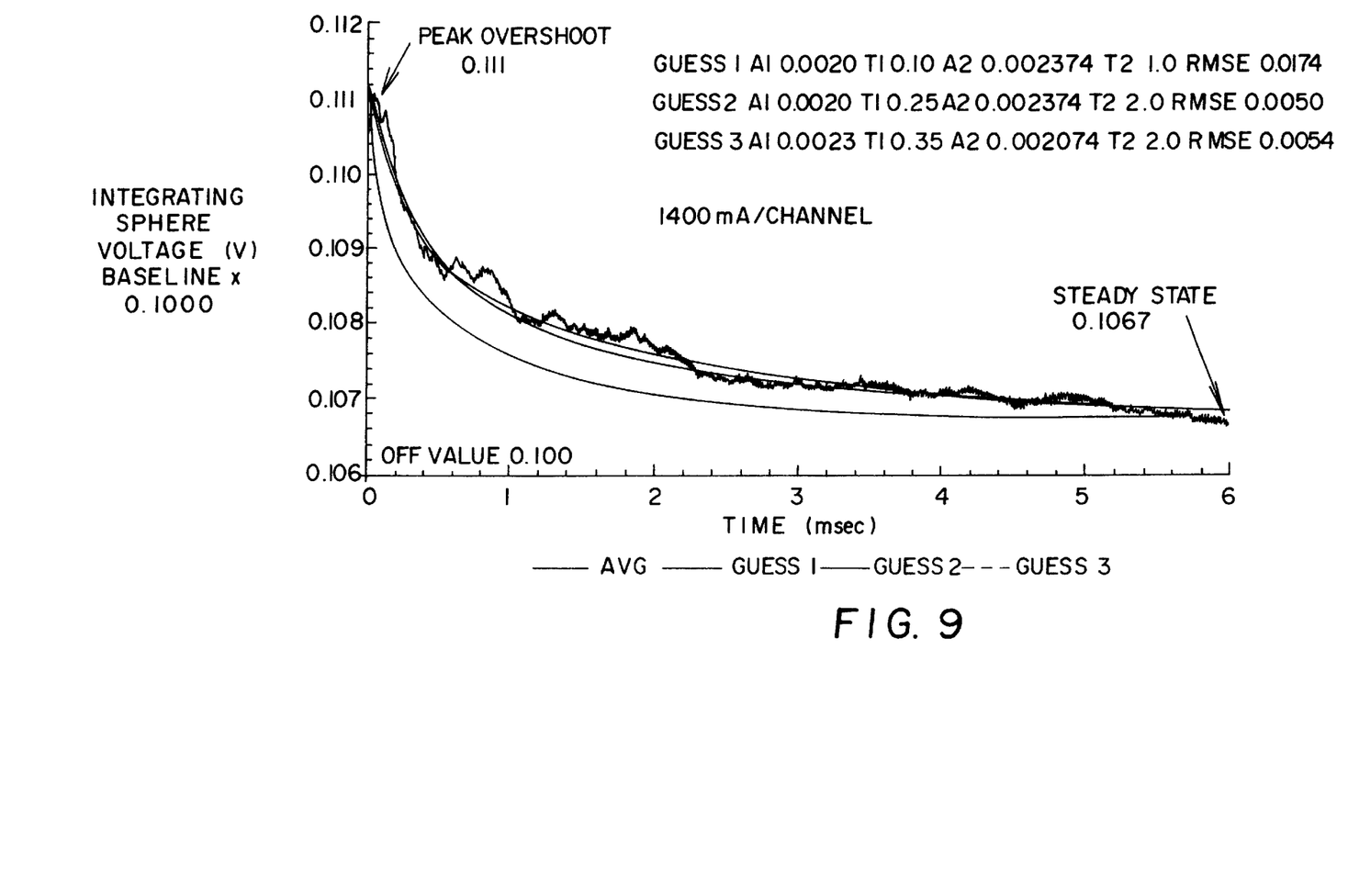
FIG. 9 is a graph of thermal droop of optical power over time, absent thermal compensation.

FIG. 9 shows the thermal droop of optical power over time as the substrate heats up, absent thermal compensation. The filter stages in thermal compensator 70 adjust a compensated reference signal 76 to constant current source 60 to drive laser diode 90 to provide a constant optical output power. In operation, thermal compensator 70 alters a level of constant current source 60 as a function of on-time of the laser diode 90. This provides a faster response time than cooling the laser diode or the laser diode substrate.

Sampling and Hold Circuit

Figure 10:
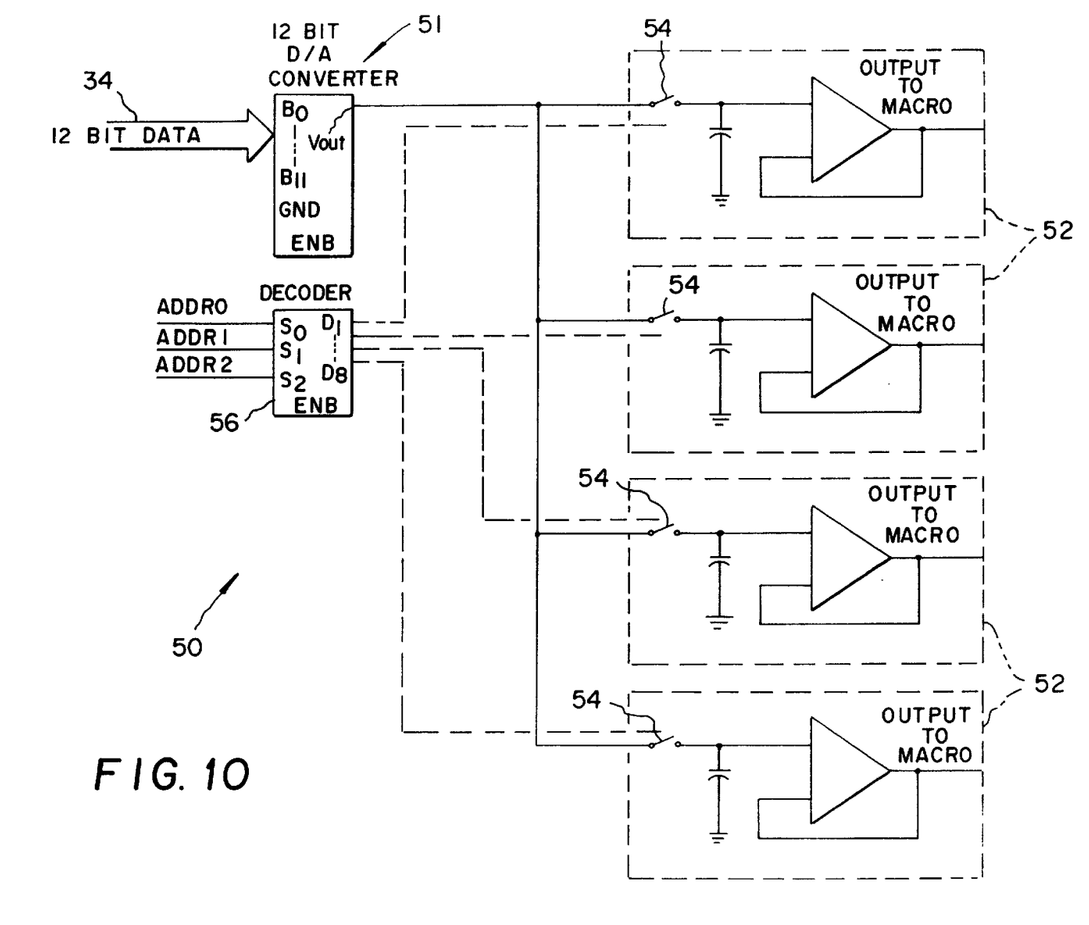
FIG. 10 is a block diagram of an array of sample and hold amplifiers according to the present invention.

The microprocessor also supplies analog input data 34 such as address information, and sample and hold data to sample and hold array 50, shown in more detail in FIG. 10. To calibrate optical laser power within less than 2% variation between all the channels of a multi-mode laser diode array 12, a twelve bit Digital to Analog Converter (DAC) is normally required for each channel to control driving current, for example a ten channel laser diode array would require ten DACs. Even though the price of DACs has been coming down steadily, it is expensive to construct a printhead having a significant number of channels with each channel having a DAC. One aspect of this invention is to replace the plurality of 12 bit DACs with a simple, less expensive sampling and hold array 50 with a single DAC 51, which has the same functionality as a plurality of 12 bit DACs in prior art controllers.

The microprocessor also holds a Look-Up Table (LUT) for calibration data for each laser channel, a history of laser calibrations such as calibration date and time, several pages of past LUT data, and the calibration algorithm which can be called up by the calibration procedure to build new LUT using each laser diode's power versus driving current data. The microprocessor selects an address in a decoder 56 which selects the proper channel by closing switch 54 of a sample and hold circuit 52. The 12 bit value which represents the desired analog voltage of the channel to be refreshed is also provided by the microprocessor. The input voltage, reference signal 58, and the required magnitude of thermal compensation 59 to the thermal compensator 70, are refreshed during the non-imaging duration each drum revolution. The typical drooping rate of the sample and hold circuit is about 0.006 volts per second which is small enough to maintain the accuracy required.

Thermo Electric Cooler (TEC) Controller

It is well known that laser diode optical output has a thermal dependence, therefore, it is necessary to maintain the laser diode substrate as close as possible to a constant temperature. The optical power goes down to a steady state power level as temperature of the active cavity of a laser diode increases due to self-heating, with a typical time constant on the order of a few milliseconds depending on a thermal mass of the laser diode. Short term thermal changes are compensated for by the thermal compensator 70 described above.

Figure 11:
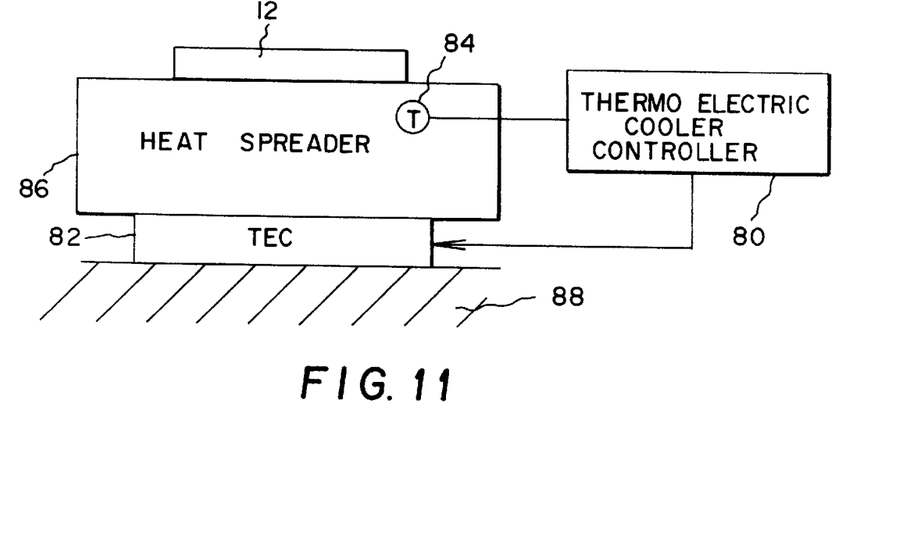
FIG. 11 is a plan view, partially in section, of a laser diode temperature control system.
Figure 12:
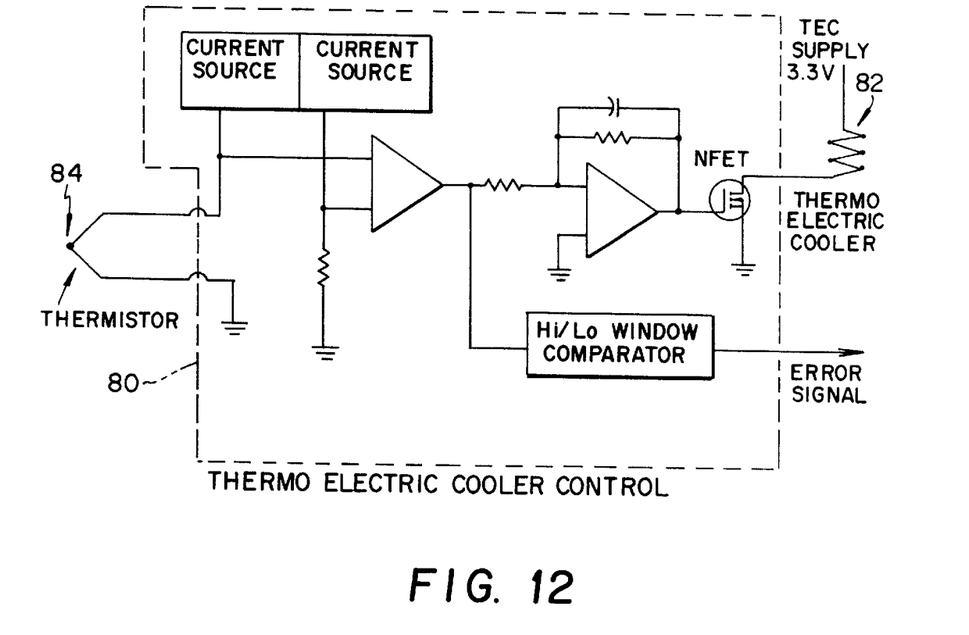
FIG. 12 is a circuit diagram of a thermo electric cooler control according to the present invention.

Thermo electric cooler (TEC) controller 80 compensates for cumulative heating due to operation of the laser diode array over a period of time. Referring to FIGS. 11 and 12, the typical thermal response time of the system is on the order of several seconds. As laser diode array 12 generates heat, copper heat spreader 86 increases in temperature. Thermistor 84 senses the temperature rise and thermo electric cooler controller 80 increases current to thermo electric cooler 82 which pumps heat from the heat spreader 86 to heat sink 88. Thermo electric controller 80, TEC 82, and thermistor 84, comprise laser diode temperature controller 81.

Application Specific Integrated Circuit (ASIC)

An ASIC is a circuit designed to have many or all electrical components on a single chip. ASIC designs allow several performance advantages, one of which is a circuit having fast current rise/fall times, typically less than 20 nanosecond. For a high productivity printing system with many writing channels, an ASIC design minimizes the cost and physical size of the control electronics. In the preferred embodiment, current shunt switch 40, sample and hold array 50, thermal compensator 70, constant current source 60, and thermo electric cooler controller 80 are integrated into an ASIC. A laser diode controller designed in this fashion is simple and compact with significantly less discrete components.

The invention has been described in detail with particular reference to certain preferred embodiments thereof, but it will be understood that variations and modifications can be effected within the spirit and scope of the invention. This type of laser diode controller can be used on printheads for external drums, internal drums, or flat bed scanners. The laser diode controller described in the present invention could also be incorporated in a flying spot imaging system or a lead screw driven system as is well known in the art.

PARTS LIST

| | |
|---|---|
| 10 | optical arrangement |
| 12 | laser diode array |
| 13 | laser diode sources |
| 14 | substrate |
| 16 | first cylinder lens |
| 18 | second cylinder lens |
| 20 | micro lenslet array |
| 22 | printing lens |
| 30 | laser diode controller |
| 32 | image data |
| 34 | analog input data |
| 40 | current shunt switch |
| 42 | bypass circuit |
| 44 | logic signal |
| 46 | NMOSFET |
| 50 | sample and hold array |
| 51 | 12 bit DAC |
| 52 | sample and hold circuit |
| 54 | analog switch |
| 56 | decoder |
| 58 | reference signal |
| 59 | compensation magnitude |
| 60 | constant current source |
| 62 | laser power supply |
| 64 | PMOSFET |
| 66 | NMOSFET |
| 68 | amplifier |
| 70 | thermal compensator |
| 72 | filter stage |
| 74 | filter stage |
| 76 | compensated reference signal |
| 80 | thermo electric cooler controller |
| 81 | temperature controller |
| 82 | thermo electric cooler |
| 84 | thermistor |
| 86 | heat spreader |
| 88 | heat sink |
| 90 | laser diode |
| 92 | cathode |
| 94 | anode |

What is claimed is:

1. A laser diode controller comprising:

a constant current source wherein said constant current source supplies current to a laser diode;

a current shunt switch which directs current to either said laser diode or to a bypass circuit;

a thermal compensator which alters a level of said constant current source as a function of on-time of said laser diode to compensate for changes in optical power conversion efficiency due to temperature changes in said laser diode; and a thermo electric cooler controller which maintains a constant temperature of a substrate for said laser diode.

2. A laser diode controller as in claim 1 wherein said constant current source is connected to a system ground and said current shunt switch is connected to a laser power supply.

3. A laser diode controller as in claim 1 wherein said current shunt switch is connected to a system ground and said constant current source is connected to a laser power supply.

4. A laser diode controller as in claim 1 wherein said thermo electric cooler controller receives input from a temperature sensor and provides a signal to a thermal electric cooler (TEC).

5. A laser diode controller as in claim 1 wherein said constant current source, said current shunt switch, said thermal compensator, and said thermo electric cooler controller are contained on an application specific integrated circuit (ASIC).

6. A laser diode controller as in claim 5 wherein said ASIC contains an array of sample and hold amplifiers which provides analog setpoints for said constant current source, said current shunt switch, said thermal compensator, and said thermo electric cooler controller.

7. A laser diode controller as in claim 1 wherein said current shunt switch is capable of switching a two amp current in less than 20 nanoseconds.

8. A laser diode controller as in claim 1 wherein said laser diode controller is incorporated in a multiple channel laser printing system.

9. A laser diode controller as in claim 1 wherein said laser diode controller is incorporated in a thermal printing system.

10. A laser diode controller as in claim 1 wherein said laser diode controller is incorporated in a printing system with an internal drum.

11. A laser diode controller as in claim 1 wherein said laser diode controller is incorporated in a printing system with an external drum.

12. A laser diode controller as in claim 1 wherein said thermal compensator has a plurality of filter stages to provide a constant optical power output as temperature changes.

13. A laser diode controller as in claim 12 wherein each of said filter stages has a RC circuit providing time constants.

14. A laser diode controller comprising:

a constant current source wherein said constant current source supplies current to a laser diode;

a current shunt switch which directs current to either said laser diode or to a bypass circuit;

a thermal compensator which alters a level of said constant current source as a function of on-time of said laser diode to compensate for changes in optical power conversion efficiency due to temperature changes in said laser diode;

a laser diode temperature controller which maintains a constant temperature of a substrate for said laser diode; and an array of sample and hold amplifiers which provides analog setpoints for said constant current source, said current shunt switch, said thermal compensator, and said laser diode temperature controller.

15. A laser diode controller as in claim 14 wherein said laser diode temperature controller is comprised of a temperature sensor and a thermal electric cooler (TEC).

16. A laser diode controller as in claim 14 wherein said constant current source, said current shunt switch, said thermal compensator, and said laser diode temperature controller are contained on an application specific integrated circuit (ASIC).

17. A laser diode controller as in claim 16 wherein said ASIC contains said array of sample and hold amplifiers.

18. A laser diode controller as in claim 14 wherein said current shunt switch is capable of switching a two amp current in less than 25 nanoseconds.

19. A laser diode controller as in claim 14 wherein said laser diode controller is incorporated in a multiple channel laser printing system.

20. A laser diode controller as in claim 14 wherein said laser diode controller is incorporated in a thermal printing system.

21. A laser diode controller as in claim 14 wherein said laser diode controller is incorporated in a printing system with an internal drum.

22. A laser diode controller as in claim 14 wherein said laser diode controller is incorporated in a printing system with an external drum.

23. A laser diode controller as in claim 14 wherein said thermal compensator is programmed to provide a constant optical power output as temperature changes.

24. A laser diode controller as in claim 14 wherein said thermal compensator is programmed with multiple time constants.

25. A laser diode controller comprising:

a constant current source wherein said constant current source supplies current to a laser diode;

a current shunt switch which directs current to either said laser diode or to a bypass circuit; and a thermal compensator which alters a level of said constant current source as a function of on-time of said laser diode to compensate for changes in optical power conversion efficiency due to temperature changes in said laser diode.

* * * * *